US012696586B2

(12) United States Patent
Li et al.

(10) Patent No.: US 12,696,586 B2
(45) Date of Patent: Jul. 28, 2026

(54) ACTIVATION OF P-TYPE LAYERS OF TUNNEL JUNCTIONS

(71) Applicant: The Regents of the University of California, Oakland, CA (US)

(72) Inventors: Panpan Li, Goleta, CA (US); Hongjian Li, Goleta, CA (US); Michael Iza, Goleta, CA (US); Shuji Nakamura, Santa Barbara, CA (US); Steven P. DenBaars, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 740 days.

(21) Appl. No.: 18/041,269

(22) PCT Filed: Aug. 11, 2021

(86) PCT No.: PCT/US2021/045495
§ 371 (c)(1),
(2) Date: Feb. 10, 2023

(87) PCT Pub. No.: WO2022/035934
PCT Pub. Date: Feb. 17, 2022

(65) Prior Publication Data
US 2023/0307579 A1 Sep. 28, 2023

Related U.S. Application Data

(60) Provisional application No. 63/064,113, filed on Aug. 11, 2020.

(51) Int. Cl.
*H01L 33/32* (2010.01)
*H10H 20/01* (2025.01)
(Continued)

(52) U.S. Cl.
CPC .... *H10H 20/825* (2025.01); *H10H 20/01335* (2025.01); *H10H 20/813* (2025.01);
(Continued)

(58) Field of Classification Search
CPC .......... H10H 20/825; H10H 20/01335; H10H 20/813; H10H 20/82; H10H 29/142; H10H 29/10; H01L 25/167
See application file for complete search history.

(56) References Cited

U.S. PATENT DOCUMENTS

| | | | |
|---|---|---|---|
| 6,526,082 B1 | 2/2003 | Corzine et al. | |
| 2002/0105013 A1* | 8/2002 | Iyechika | H10H 20/8252 |
| | | | 257/200 |

(Continued)

OTHER PUBLICATIONS

Canadian Examiner's Report dated Jul. 24, 2024 for Canadian Patent Application No. 3,191,933.
(Continued)

*Primary Examiner* — Mohammed R Alam
(74) *Attorney, Agent, or Firm* — Gates & Cooper LLP

(57) ABSTRACT

A method to fabricate micro-size III-nitride light emitting diodes ($\mu$LEDs) with an epitaxial tunnel junction comprised of a p+GaN layer, an $In_xAl_yGa_zN$ insertion layer, and an n+GaN layer, grown using metalorganic chemical vapor deposition (MOCVD), wherein the $\mu$LEDs have a low forward voltage. The $In_xAl_yGa_zN$ insertion layer has a smaller energy bandgap than the GaN layers, which reduces a depletion width of the tunnel junction and increases the tunneling probability. The $\mu$LEDs are fabricated with dimensions that vary from 25 to 10,000 $\mu m^2$. It was found that the $In_xAl_yGa_zN$ insertion layer can reduce the forward voltage at 20 A/cm$^2$ by at least 0.6 V. The tunnel junction $\mu$LEDs with an n-type and p-type $In_xAl_yGa_zN$ insertion layer had a low forward voltage at 20 A/cm$^2$ that was very stable. At dimen-
(Continued)

LED 200

Access points 207 — Access points 207 n-type tunnel junction layer(s) 206

InAlGaN insertion layer(s) 205 p-type layer(s) 204

Light emitting layer(s) 203 n-type layer(s) 202

Substrate 201 sions smaller than 1600 $\mu m^2$, the low forward voltage is less than 3.2 V.

20 Claims, 15 Drawing Sheets

(51) Int. Cl.

| | | |
|---|---|---|
| *H10H 20/813* | (2025.01) | |
| *H10H 20/82* | (2025.01) | |
| *H10H 20/825* | (2025.01) | |
| *H10H 29/14* | (2025.01) | |
| *H10W 90/00* | (2026.01) | |

(52) U.S. Cl.
CPC .......... *H10H 20/82* (2025.01); *H10H 29/142* (2025.01); *H10W 90/00* (2026.01)

(56) References Cited

U.S. PATENT DOCUMENTS

| | | | |
|---|---|---|---|
| 2009/0061636 A1 | 3/2009 | Lee et al. | |
| 2014/0218909 A1 | 8/2014 | Tetsuo et al. | |
| 2016/0225942 A1* | 8/2016 | Aota ...................... | H10H 20/82 |
| 2017/0338369 A1* | 11/2017 | Wildeson ............. | H10H 20/812 |
| 2018/0219123 A1* | 8/2018 | Wang ...................... | H10H 29/10 |
| 2019/0198709 A1 | 6/2019 | Wildeson et al. | |
| 2019/0198714 A1* | 6/2019 | Sato ...................... | H10H 20/831 |
| 2019/0245112 A1 | 8/2019 | Alhassan et al. | |

OTHER PUBLICATIONS

Malinverni, M., et al. "InGaN based micro light emitting diodes featuring a buried GaN tunnel junction." Appl. Phys. Lett. 107, [online], Aug. 6, 2015 (Aug. 6, 2015), pp. 051107-1 to 051107-4.

PCT International Search Report and Written Opinion dated Nov. 15, 2021 for PCT Application No. PCT/US2021/45495.

Korean Notice of Non-Final Rejection (with English translation) dated Aug. 30, 2024 for Korean Patent Application No. 10-2023-7008631.

Esaki, "New Phenomenon in Narrow Germanium p. n Junctions," Phys. Rev., vol. 109, No. 2, pp. 603-604, Jan. 1958.

Krishnamoorthy et al., "InGaN/GaN tunnel junctions for hole injection in GaN light emitting diodes," Appl. Phys. Lett., vol. 105, No. 14, p. 141104-1 to 141104-4, Oct. 2014.

Krishnamoorthy et al., "Low resistance GaN/InGaN/GaN tunnel junctions," Appl. Phys. Lett., vol. 102, No. 11, 2013, bages 2570-2575.

Li et al., "Size-independent low voltage of InGaN micro-light-emitting diodes with epitaxial tunnel junctions using selective area growth by metalorganic chemical vapor deposition", Optics Express, 28, 18707 (2020), 6 pages.

Simon et al., "Polarization-induced hole doping in wide-band gap uniaxial semiconductor heterostructures," Science, vol. 327, No. 5961, pp. 60-64, Jan. 2010.

Canadian Examiner's Report dated Oct. 1, 2025 for Canadian Patent Application No. 3,191,933.

\* cited by examiner

LED 100

LED 600

LED 700

LED 1100

Method 1500

Forming n-type layer(s) 1501

Forming light emitting layer(s) 1502

Forming p-type layer(s) 1503

Performing a surface treatment 1504

Forming InAlGaN insertion layer(s) 1505

Forming n-type tunnel junction layer(s) 1506

Activating p-type layer(s) 1507

Resulting device structure 1508

ACTIVATION OF P-TYPE LAYERS OF TUNNEL JUNCTIONS

CROSS REFERENCE TO RELATED APPLICATIONS

This application claims the benefit under 35 U.S.C. Section 119(e) of the following co-pending and commonly-assigned application:

U.S. Provisional Application Ser. No. 63/064,113, filed on Aug. 11, 2020, by Panpan Li, Hongjian Li, Michael Iza, Shuji Nakamura and Steven P. DenBaars, entitled "ACTIVATION OF P-TYPE LAYERS OF TUNNEL JUNCTIONS,";

which application is incorporated by reference herein.

BACKGROUND OF THE INVENTION

1. Field of the Invention

This invention relates to a method of fabricating micro-size light emitting diodes (μLEDs) with an epitaxial tunnel junction grown by metalorganic chemical vapor deposition (MOCVD).

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

Current commercial III-nitride light emitting diodes (LEDs) and laser diodes (LDs) employ the use of an n-type region, an active region where light is generated, and a p-type region to form a diode. The emission wavelength covers from ultraviolet wavelength to red, and even infrared red. However, p-type gallium nitride (p-GaN) is difficult to contact electrically, and has low hole concentration and mobility. This means that p-GaN cannot be used as a current spreading layer and that traditional p-contacts will add significant voltage to devices. Despite these inherent problems, all commercial light emitting devices utilize traditional p-contacts and materials other than p-GaN for current spreading, which typically comprise transparent conducting oxides (TCO), such as indium tin oxide (ITO).

A low resistance tunnel junction (TJ) on top of p-GaN would allow for current spreading in n-type GaN (n-GaN) on both sides of the device, as well as the use of low resistance n-type contacts on both sides of the device. A tunnel junction is a diode comprised of a very highly doped (n+/p+) interface that allows for electrons to tunnel between the valence band and conduction band. This was first demonstrated by Esaki [1] in highly-doped germanium (Ge) homojunctions with very thin depletion regions.

However, GaN is a wide bandgap semiconductor, so the barrier for tunneling is high. Several approaches to reducing the tunneling barrier have been attempted, including bandgap engineering via polarization with aluminum nitride (AlN) interlayers [2], reducing the bandgap with an indium gallium nitride (InGaN) interlayer [3], and introducing defect states via interfacial GaN nanoparticles [4]. However, all of these approaches are associated with losses, either in terms of voltage or resistance increases, or optical losses in the final device performance.

In another example, magnesium (Mg) doped p-GaN grown by MOCVD is compensated by hydrogen as grown, and it must be annealed after growth to remove the hydrogen. This anneal can only work if the p-GaN is not covered by n-GaN, as hydrogen cannot easily diffuse through n-GaN. [5] This limits the effectiveness of tunnel junctions and prevents their widespread use.

In another example, a light emitting device can be fabricated by first growing the n-type, active and p-type regions by MOCYD and then depositing the n-type tunnel junction above the device by other deposition techniques such as molecular beam epitaxy (MBE). This method allows for the p-type region to remain electrically conductive, thus forming a tunnel junction. However, this method requires two separate deposition techniques. These two techniques increase the complexity and cost of fabrication.

Additionally, III-nitride based μLEDs, which are LEDs having device areas less than 10,000 $\mu m^2$, are promising candidate for next-generation display applications, including near-eye displays and head-up displays. μLEDs are characterized by their small size, typically less than 10,000 $\mu m^2$, as compared to standard LEDs. Employing the use of a III-nitride μLED devices with a tunnel junction enables the realization to cascade μLEDs with different emission color such blue, green, and red. This technique would enable the integration of blue, green and red μLEDs in one device.

However, the LEDs which incorporate tunnel junction layers exhibit high operating voltages compared to conventional LEDs as described above. Moreover, the forward voltage of tunnel junction μLEDs by MOCVD is very sensitive to the device dimensions, which greatly hinders commercialization.

Thus, there is a need in the art for structure for improving the performance of III-nitride devices. The present invention satisfies this need.

SUMMARY OF THE INVENTION

To overcome the limitations of the prior art described above, the present invention discloses a method to fabricate μLEDs with an epitaxial tunnel junction comprised of p+GaN, $In_xAl_yGa_zN$ insertion layers, and n+GaN layers grown using MOCVD and having low forward voltage. The $In_xAl_yGa_zN$ insertion layers have a lower bandgap than GaN to reduce the depletion width and to increase the tunnel probability.

After growth of the p+GaN layer in an MOCVD reactor, the sample is taken out of the reactor. The sample is treated with a solvent clean and chemical treatment to remove oxygen. Then, the sample is loaded into the reactor for the following growth of the $In_xAl_yGa_zN$ insertion layers and n+GaN layers to form the tunnel junction, Patterns of features result in access points comprising holes or vias in the n+GaN and n−GaN layers or sidewalk to expose the p+type layer that provide for activation of the p+type layer.

Using this method, tunnel junction μLEDs were fabricated with dimensions that varied from 100 to 10,000 $\mu m^2$. It was found that the μLEDs with tunnel junctions having $In_xAl_yGa_zN$ insertion layers had a forward voltage at 20 $A/cm^2$ that was very stable and uniform around 3.08 to 3.3 V. Such a low forward voltage for tunnel junctions μLEDs is very important for various applications.

Moreover, tunnel junction μLEDs offer several advantages such as a simple fabrication process, a better current spreading, and a higher output power. Also, tunnel junction µLEDs enable the realization of cascade µLEDs integrating with different emission colors like blue, green and red.

DETAILED DESCRIPTION OF THE INVENTION

Figure 1:
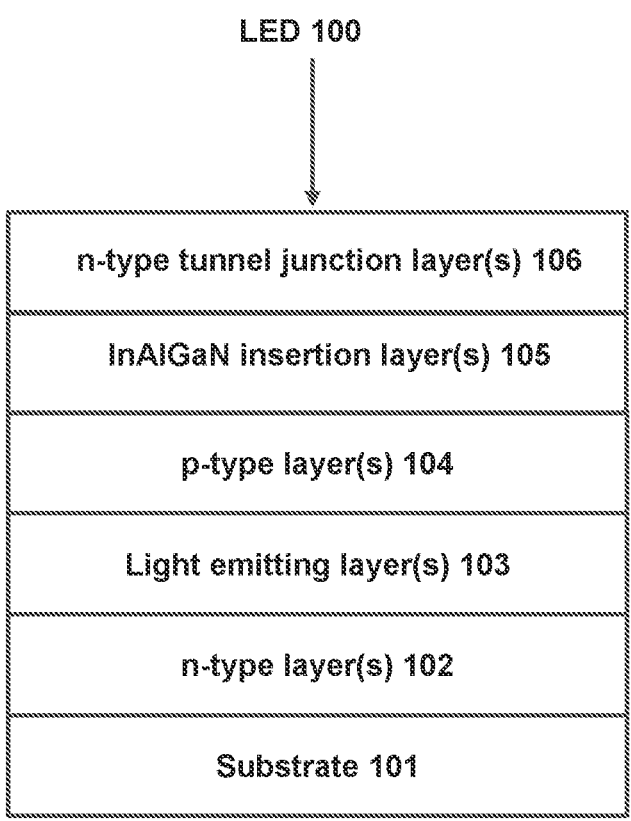
FIG. 1 is a cross-sectional schematic (side view) of a device with a tunnel junction structure having an $In_xA$-$l_yGa_zN$ insertion layer.

In the following description of the preferred embodiment, reference is made to the accompanying drawing which forms a part hereof, and in which is shown by way of illustration a specific embodiment in which the invention may be practiced. It is to be understood that other embodiments may be utilized, and structural changes may be made without departing from the scope of the present invention.

Overview

The present invention describes III-nitride light emitting device structures incorporating a tunnel junction fabricated using MOCVD. The use of an $In_xAl_yGa_zN$ insertion layer in a tunnel junction incorporated into light emitting devices offers a means of improving the III-nitride light emitting devices' performance.

Epitaxially grown GaN tunnel junctions by MOCVD have been widely investigated, but still face challenges of high operating voltages. These structures show a drastic degradation in device performance with various device sizes, such as power output and operating voltage at a constant current.

The present invention describes a method to fabricate III-nitride µLEDs with epitaxial tunnel junctions using MOCVD, as well as the resulting device having low forward voltage. III-nitride light emitting device structures incorporating $In_xAl_yGa_zN$ insertion layers with the tunnel junctions provide a means of enhancing the performance of III-nitride light emitting devices by greatly enhancing the devices' output power and operating voltage at constant current.

A preferred embodiment of the present invention is a III-nitride semiconductor device comprised of at least an n-type layer, an active (light emitting) region, and a p-type layer laminated onto a substrate. The method comprises the steps of growing an $In_xAl_yGa_zN$ insertion layer and a highly doped n-type tunnel junction layer on or above the p-type layer to form a tunnel junction.

In one embodiment, the n-type tunnel junction layer is comprised of GaN with a thickness of about 300 nm. Preferably, the $In_xAl_yGa_zN$ insertion layer would be comprised of one or more films and have an Si doping concentration or Mg doping concentration greater than $1 \times 10^{19}$ cm⁻³. Subsequent n-type layer layers may be comprised of III-nitride films with lower doping concentrations, such that the Si doping concentration is preferably about $1.5 \times 10^{20}$ cm⁻³.

In one embodiment, the device is fabricated such that the n-type tunnel junction layer does not completely cover the p-type layer. This partial coverage can be achieved by various methods, including post growth etching of the n-type tunnel junction layer, or masking of the p-type layer prior to deposition of the n-type tunnel junction layer and performing selective area growth (SAG) or epitaxial lateral overgrowth (FLOG) on the masked p-type layer. [5] As a result, the n-type tunnel junction layer contains access points comprising holes or vias to the p-type layer located underneath.

The access points to the p-type layer can be fabricated by selectively etching a portion of the n-type tunnel junction layer to partially expose the p-type layer. The etching can be performed by reactive ion etching (RIE), inductively coupled plasma (ICP) etching, or wet etching with an appropriate chemistry, or a combination thereof.

The access points to the p-type layer can also be fabricated using a mask and selective area growth, wherein a dielectric, such as $SiO_2$, SiN or other Si containing material, may be patterned onto the p-type layer. The pattern may be comprised of circles, squares, stripes, hexagons, or other geometric shapes, or combinations of shapes, that are used to create the access points. The n-type tunnel junction layer is subsequently laminated on top of the dielectric and the exposed p-type layer by the selective area growth. The dielectric is afterward removed from the p-type layer, thus leaving a partially exposed p-type layer by means of the access points.

Furthermore, it is preferable that the percent coverage of the p-type layer by the n-type tunnel junction layer remaining after the access points are fabricated be greater than 50%, and more preferably greater than 80%.

By forming a highly-doped n-type tunnel junction layer that partially covers the p-type layer, the operating voltage of these III-nitride devices can be reduced and their efficiency can be increased, as well as enabling new types of device structures, including new types of light-emitting diodes, laser diodes, vertical cavity surface emitting lasers, solar cells, and photodetectors.

Another object of the present invention is to enhance the light output power (LOP) characteristics by drastically improving the electrical properties of the contact layer of a µLED. This improvement can lead to the expansion of the use of µLEDs.

TECHNICAL DESCRIPTION

First Embodiment

FIG. 1 is a cross-sectional schematic (side view) of a device structure, according to a first embodiment of the present invention. This LED 100 is comprised of a substrate 101, upon which is deposited successively in the following order: an n-type GaN layer 102 doped with Si, a light emitting layer 103 comprising an InGaN/GaN multiple quantum well (MOW) structure, a p-type GaN layer 104 doped with Mg, an $In_xAl_yGa_zN$ insertion layer 105 and an n-type tunnel junction layer 106.

As noted above, the LED 100 according to the first embodiment has a III-nitride-based light emitting layer 103 comprised of at least one quantum well structure sandwiched between an n-type layer 102, and a p-type layer 104. The n-type GaN layer 102 doped with Si has a thickness greater than 2 µm, and more preferably, 4 µm. The light emitting layer 103 may be comprised of multiple layers of InGaN and GaN, with a total thickness of less than 1 µm, and more preferably, 200 nm. A thin InGaN quantum well less than 2.5 nm thick can alleviate the piezoelectric field and increase the luminous efficiency for red InGaN LEDs, The p-type layers 104 may be comprised of multiple layers containing AlGaN and GaN, and can be doped with Mg, wherein these layers 104 comprise a total thickness of less than 1 µm, and more preferably, 200 nm. The $In_xAl_yGa_zN$ insertion layer 105 is comprised of GaN doped with Si or Mg with a thickness greater than 0.1 nm, and more preferably, 2.5 nm. The n-type tunnel junction layer 106 is comprised of GaN doped with Si with a thickness greater than 50 nm, and more preferably, 300 nm.

Second Embodiment

Figure 2:
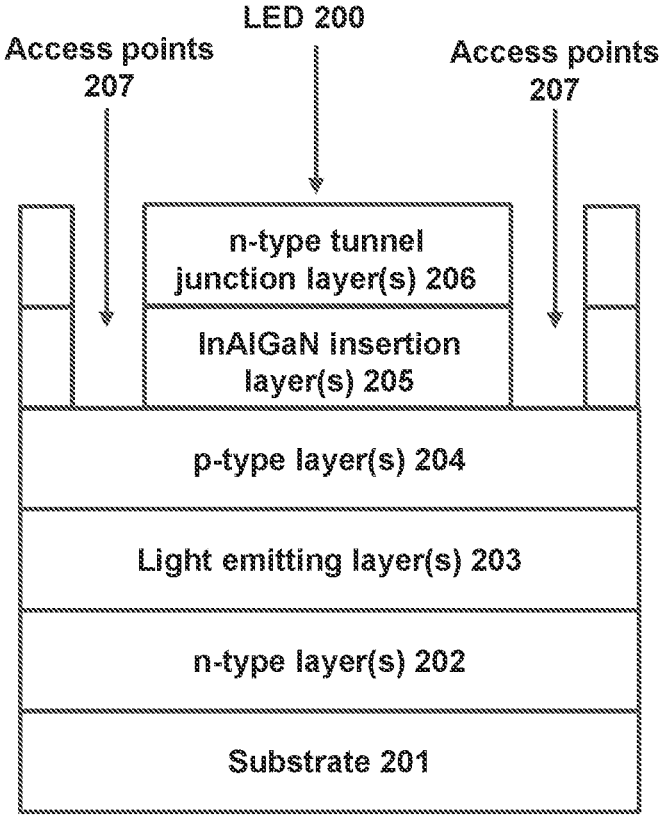
FIG. 2 is a plan schematic (side view) of a device structure with a tunnel junction structure having an $In_xAl_yGa_zN$ insertion layer and having access points comprised of apertures or vias to access a p-type layer.

FIG. 2 is a plan schematic (side view) of a device structure, according to a first embodiment of the present invention. This LED 200 is comprised of a substrate 201, upon which is deposited successively in the following order: an n-type GaN layer 202 doped with Si, a light emitting layer 203 comprising an InGaN/GaN MQW structure, a p-type GaN layer 204 doped with Mg, an $In_xAl_yGa_zN$ insertion layer 205 and an n-type tunnel junction layer 206. The LED

200 also includes a pattern of access points 207 comprising holes. The access points 207 can also be comprised of any geometric shape, such as circles, squares, stripes, hexagons, etc. and the pattern of access points 207 may also comprise a combination of shapes.

Third Embodiment

Figure 3:
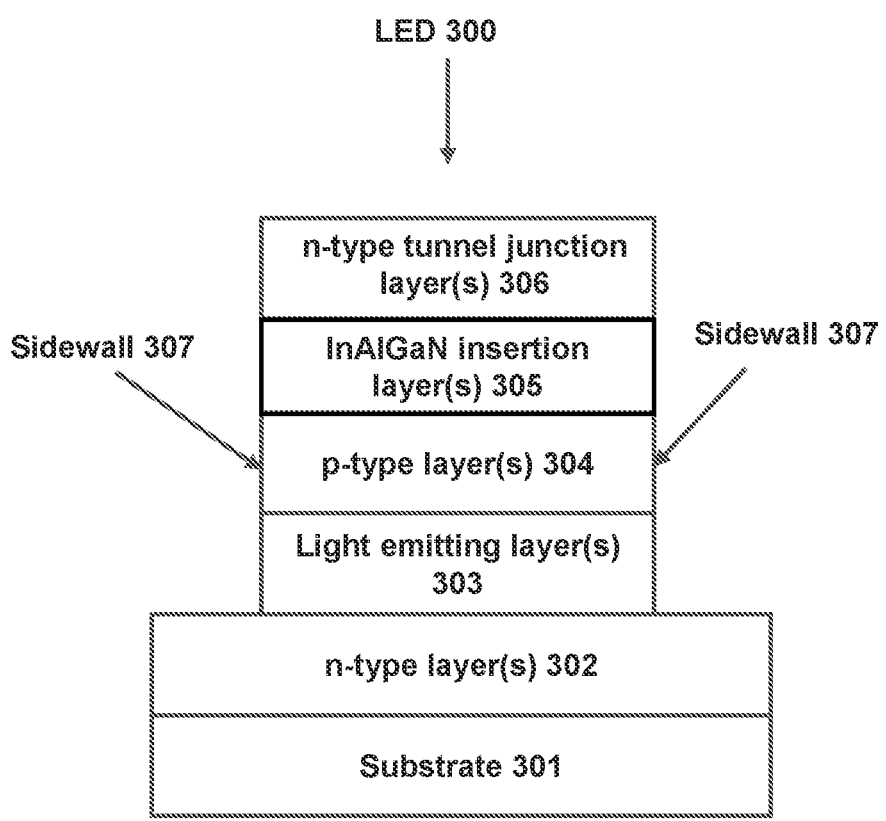
FIG. 3 is a plan schematic (side view) of a device structure with a tunnel junction structure having an $In_xAl_yGa_zN$ insertion layer and having exposed sidewalls to access a p-type layer.

FIG. 3 is a plan schematic (side view) of a device structure, according to a first embodiment of the present invention. This LED 300 is comprised of a substrate 301, upon which is deposited successively in the following order: an n-type GaN layer 302 doped with Si, a light emitting layer 303 comprising an InGaN/GaN MQW structure, a p-type GaN layer 304 doped with Mg, an $In_xAl_yGa_zN$ insertion layer 305 and an n-type tunnel junction layer 306. The LED 300 also includes etched sidewalls 307 of a mesa, which provide access for activation of the p-type layer 304. The sidewalls 307 may also be comprised of various configurations and shapes.

Fourth Embodiment

Figure 4:
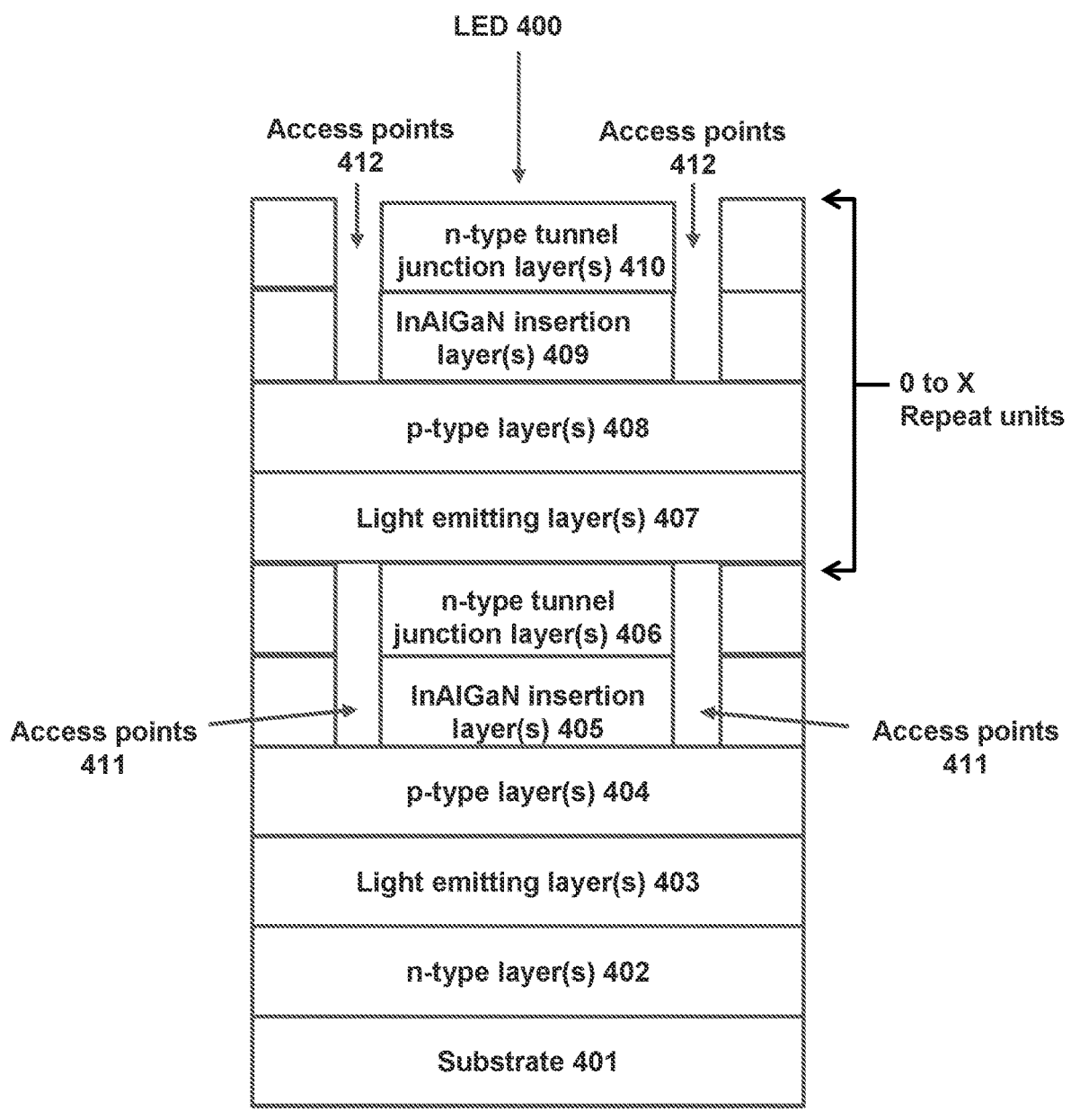
FIG. 4 is a cross-sectional schematic (side view) of a multi-junction LED with a tunnel junction structure having access points comprised of apertures or vias to access a p-type layer.

FIG. 4 is a cross-sectional schematic (side view) of a device structure, according to a second embodiment of the present invention. This LED 400 has the same structure as the first embodiment, including a substrate 401, an n-type GaN layer 402 doped with Si, a light emitting layer 403 comprising an InGaN/GaN MQW structure, a p-type GaN layer 404 doped with Mg, an $In_xAl_yGa_zN$ insertion layer 405, and an n-type tunnel junction layer 406.

This LED 400 also includes a second light emitting layer 407, a second p-type layer 408, a second $In_xAl_yGa_zN$ insertion layer 409, and a second n-type tunnel junction layer 410. These layers 407, 408, 409, 410 comprise a repeat unit that may be repeated 0 to x times, as desired.

The n-type tunnel junction layers 406, 410 partially cover and form tunnel junctions with the p-type layers 404, 408, respectively, such that portions of the p-type layers 404, 408 remain exposed by access points 411, 412, respectively. These access points 411, 412 provide access for activation of the p-type layers 404, 408, respectively.

The second light emitting layer 407 can be comprised of an InGaN/GaN MQW structure, such that the wavelength, λ1, of the light emitted from the second light emitting layer 407 is different than the wavelength, λ2, of the light emitted from the first light emitting layer 403. In one embodiment, the first light emitting layer 403 can emit light at wavelength, λ1, centered around 450 nm while the second light emitting layer 407 can emit light at a wavelength, λ2, centered around 550 nm, such that λ1≠λ2. However, in other embodiments, λ1=λ2.

Fifth Embodiment

Figure 5:
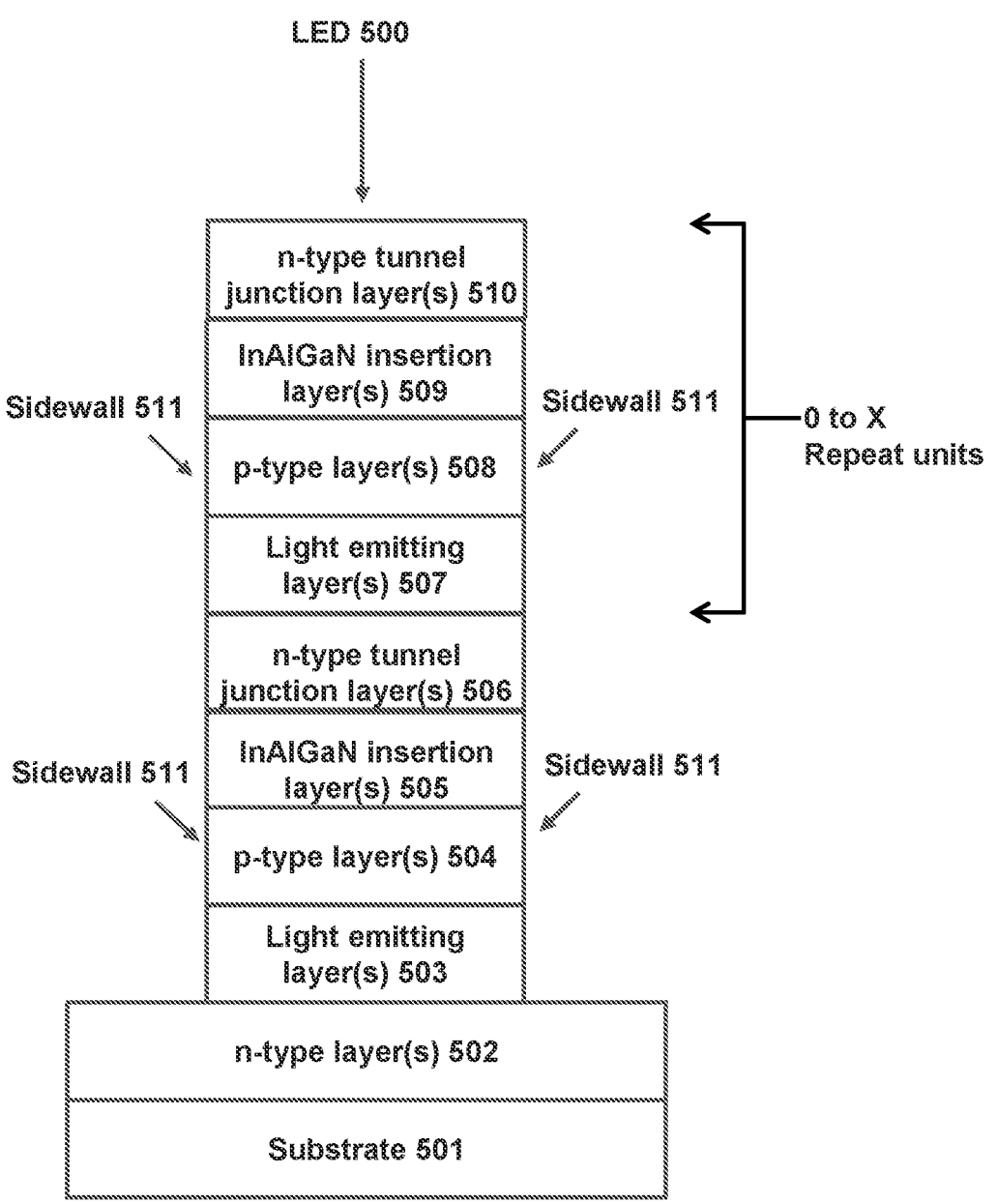
FIG. 5 is a cross-sectional schematic (side view) of a multi-junction LED with a tunnel junction structure having exposed sidewalls to access a p-type layer.

FIG. 5 is a cross-sectional schematic (side view) of a device structure, according to a third embodiment of the present invention. The LED 500 500 has a similar structure as the third embodiment, including a substrate 501, an n-type GaN layer 502 doped with Si, a light emitting layer 503 comprising an InGaN/GaN MQW structure, a p-type GaN layer 504 doped with Mg, an $In_xAl_yGa_zN$ insertion layer 505, and an n-type tunnel junction layer 506.

This LED 500 also includes a second light emitting layer 507, a second p-type layer 508, a second $In_xAl_yGa_zN$ insertion layer 509 and an n-type tunnel junction layer 510. These layers 507, 508, 509, 510 form a repeat unit of further epitaxial structures deposited on the epitaxial structure described in the first embodiment, wherein 0 to X repeat units of the further epitaxial structures may be formed on the epitaxial structure described in the first embodiment, where X is an integer.

The LED 500 also includes etched sidewalls 511 of a mesa, which provide access for activation of the p-type layers 504, 508. The sidewalls 511 may also be comprised of various configurations and shapes.

Sixth Embodiment

Figure 6:
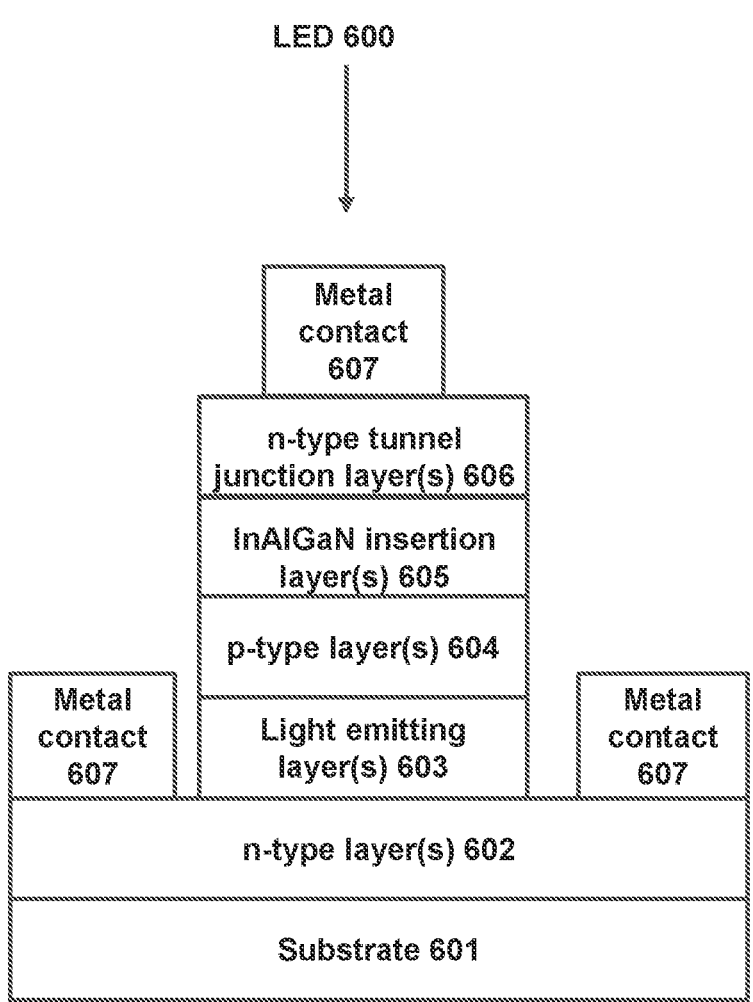
FIG. 6 is a cross-sectional schematic (side view) of a fully fabricated device structure with metal contact layers and contact pads, with a tunnel junction structure having an $In_xAl_yGa_zN$ insertion layer.

FIG. 6 is a cross-sectional schematic (side view) of a fully fabricated device structure, according to one embodiment. This device structure is an LED 600 comprised of a substrate 601, upon which is deposited successively in the following order: an n-type GaN layer 602 doped with Si, a light emitting layer 603 comprising an InGaN/GaN MQW structure, a p-type GaN layer 604 doped with Mg, an $In_xAl_yGa_zN$ insertion layer 605, and an n-type tunnel junction layer 606 which partially covers and forms a tunnel junction. Contact pads 607 are provided for the n-type layer 602 and n-type tunnel junction layer 606.

Seventh Embodiment

Figure 7:
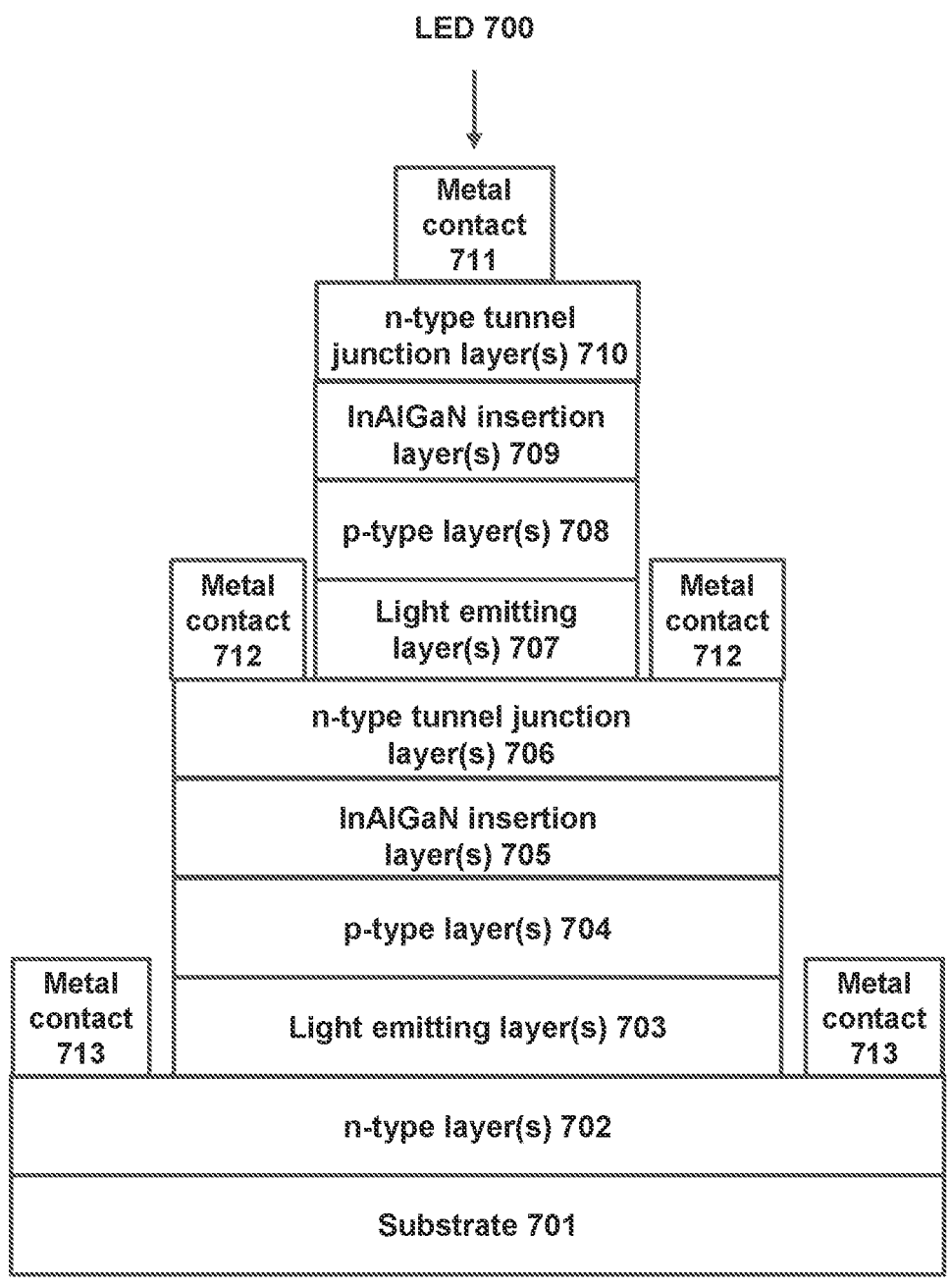
FIG. 7 is a cross-sectional schematic (side view) of a fully fabricated multi-junction LED structure with metal contact layers and contact pads, connected by a tunnel junction structure having an $In_xAl_yGa_zN$ insertion layer.

FIG. 7 is a cross-sectional schematic (side view) of a fully fabricated multiple-emitting layer device structure, according to one embodiment. This device structure is an LED 700 comprised of a substrate 701, upon which is deposited successively in the following order: an n-type GaN layer 702 doped with Si, a light emitting layer 703 comprising an InGaN/GaN MQW structure, a p-type GaN layer 704 doped with Mg, an $In_xAl_yGa_zN$ insertion layer 705, an n-type tunnel junction layer 706, a second light emitting layer 707, a second p-type layer 708, a second $In_xAl_yGa_zN$ insertion layer 709, and a second n-type tunnel junction layer 710. Contact pads 711, 712, 713 are provided for the n-type layer 702, n-type tunnel junction layer 706 and n-type tunnel junction layer 710, respectively. Multiple color emission is realized by controlling the electrical injection through the contact pads 711, 712, and 713.

Eighth Embodiment

Figure 8:
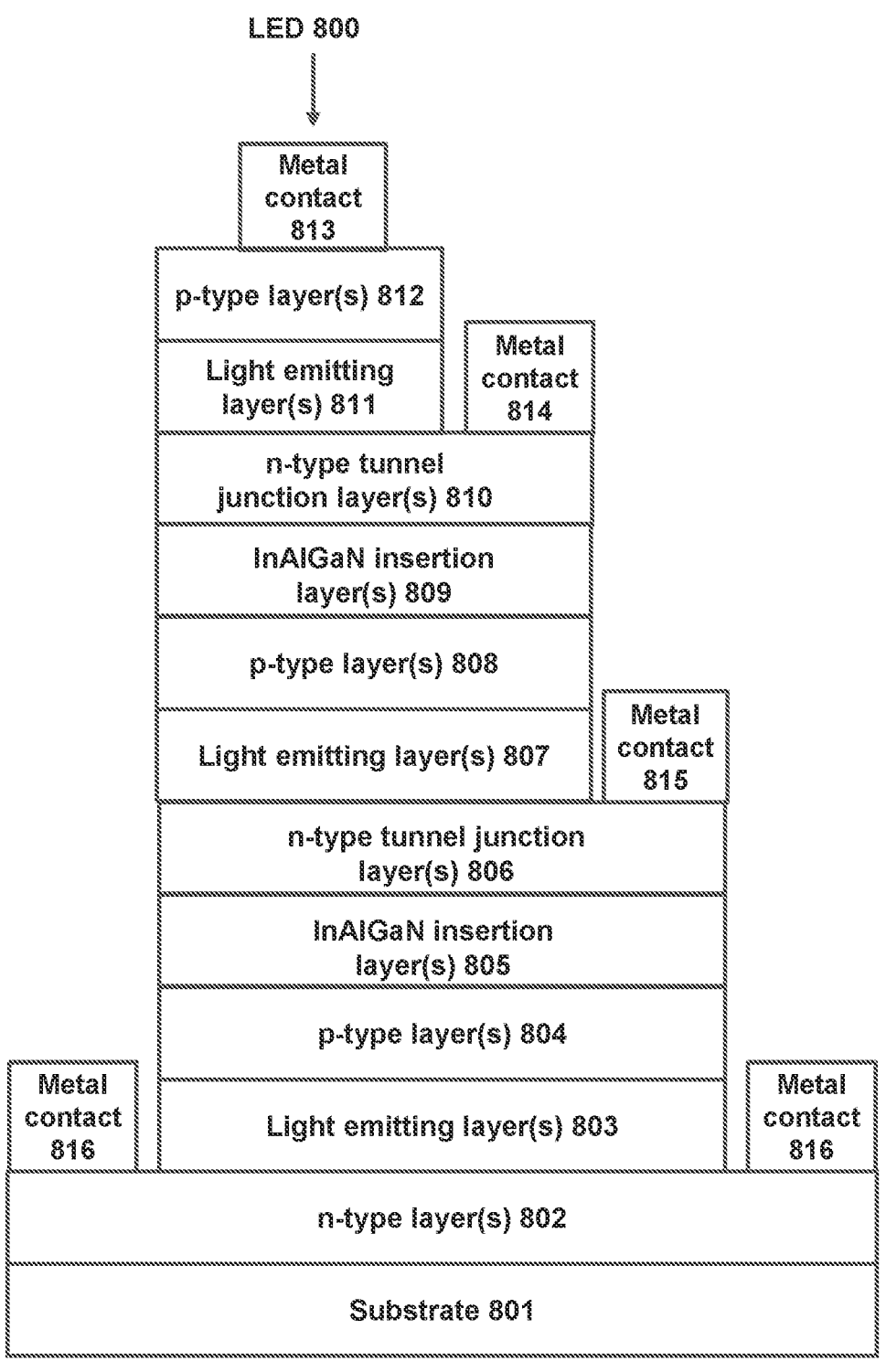
FIG. 8 is a cross-sectional schematic (side view) of a fully fabricated multi-junction three cascaded LEDs structure with metal contact layers and contact pads, connected by a tunnel junction structure having an $In_xAl_yGa_zN$ insertion layer, which can realize independent junction control.

FIG. 8 is a cross-sectional schematic (side view) of a fully fabricated multiple-emitting layer device structure, according to one embodiment. This device structure is an LED 800 comprised of a substrate 801, upon which is deposited successively in the following order: an n-type GaN layer 802 doped with Si, a light emitting layer 803 comprising an InGaN/GaN MQW structure, a p-type GaN layer 804 doped with Mg, an $In_xAl_yGa_zN$ insertion layer 805, an n-type tunnel junction layer 806, a second light emitting layer 807, a second p-type layer 808, a second $In_xAl_yGa_zN$ insertion layer 809, a second n-type tunnel junction layer 810, a third light emitting layer 811, and a third p-type layer 812. Contact pads 813, 814, 815 and 816 are provided for the n-type layer 802, n-type tunnel junction layer 806, n-type tunnel junction layer 810, and p-type layer 812, respectively. Multiple color emission such as blue, green and red is realized by independently controlling the electrical injection through the contact pads 813, 814, 815 and 816.

Ninth Embodiment

Figure 9:
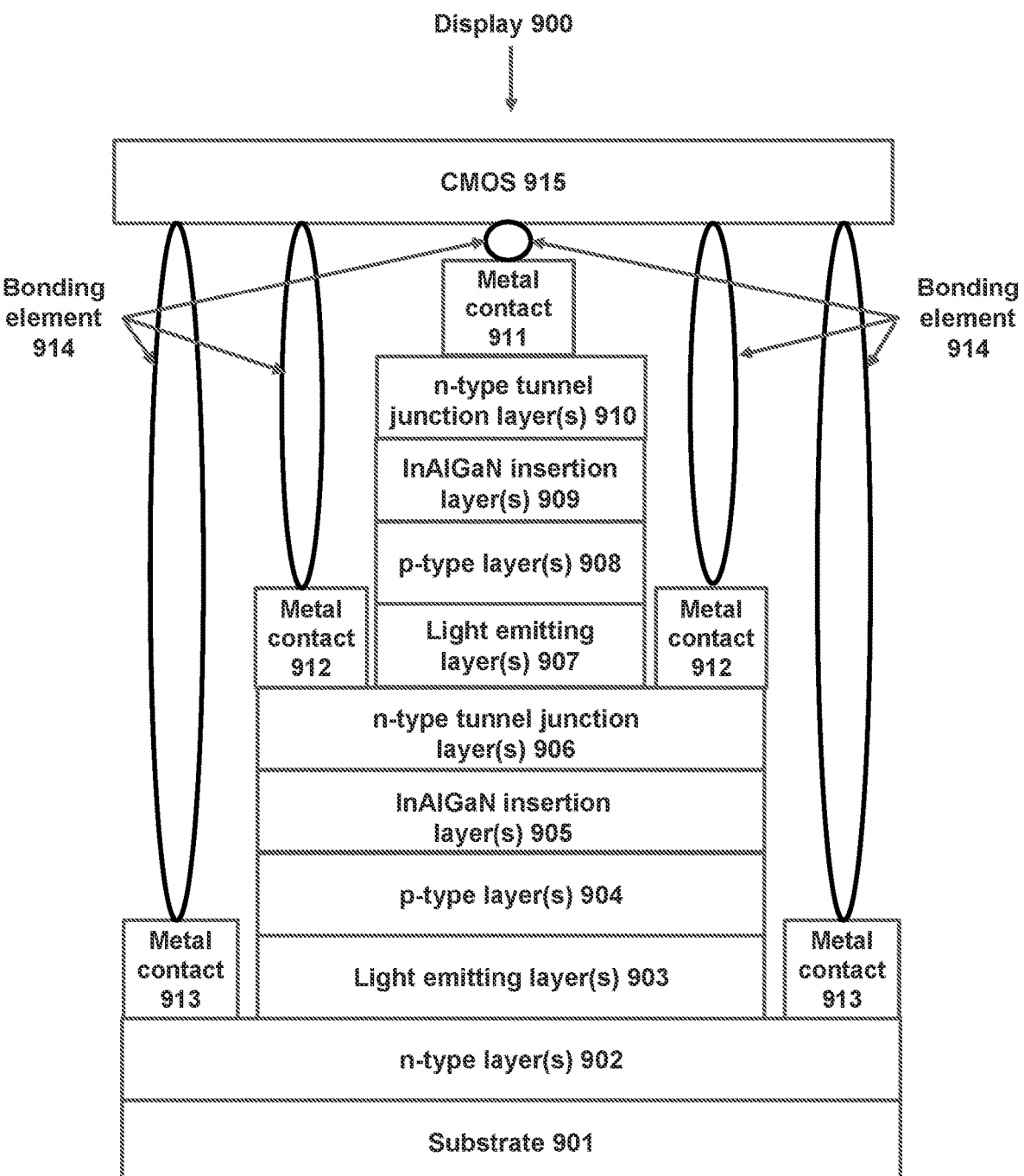
FIG. 9 is a cross-sectional schematic (side view) of a fully fabricated multi-junction LED structure with metal contact layers and contact pads, connected by a tunnel junction structure having an $In_xAl_yGa_zN$ insertion layer, and flipped chip bonded to a CMOS substrate to realize a micro display.

FIG. 9 is a cross-sectional schematic (side view) of a fully fabricated multiple-emitting layer device structure bonded to a CMOS substrate, according to one embodiment. This device structure is display 900 comprised of a substrate 901, upon which is deposited successively in the following order: an n-type GaN layer 902 doped with Si, a light emitting layer 903 comprising an InGaN/GaN MOW structure, a p-type GaN layer 904 doped with Mg, an $In_xAl_yGa_zN$ insertion layer 905, an n-type tunnel junction layer 906, a second light emitting layer 907, a second p-type layer 908, a second $In_xAl_yGa_zN$ insertion layer 909, and a second n-type tunnel junction layer 910. Contact pads 911, 912, 913 are provided for the n-type layer 902, n-type tunnel junction layer 906 and n-type tunnel junction layer 910, respectively. Multiple color emission is realized by controlling the electrical injection through the contact pads 911, 912, and 913. The cascaded LEDs are bonded by bonding element 914 to a CMOS substrate 915. Therefore, a display using cascaded micro-LEDs are formed. The space of the micro-LEDs can be reduced and the pixels per inch (PPI) of the micro-LEDs display are increased.

Tenth Embodiment

Figure 10:
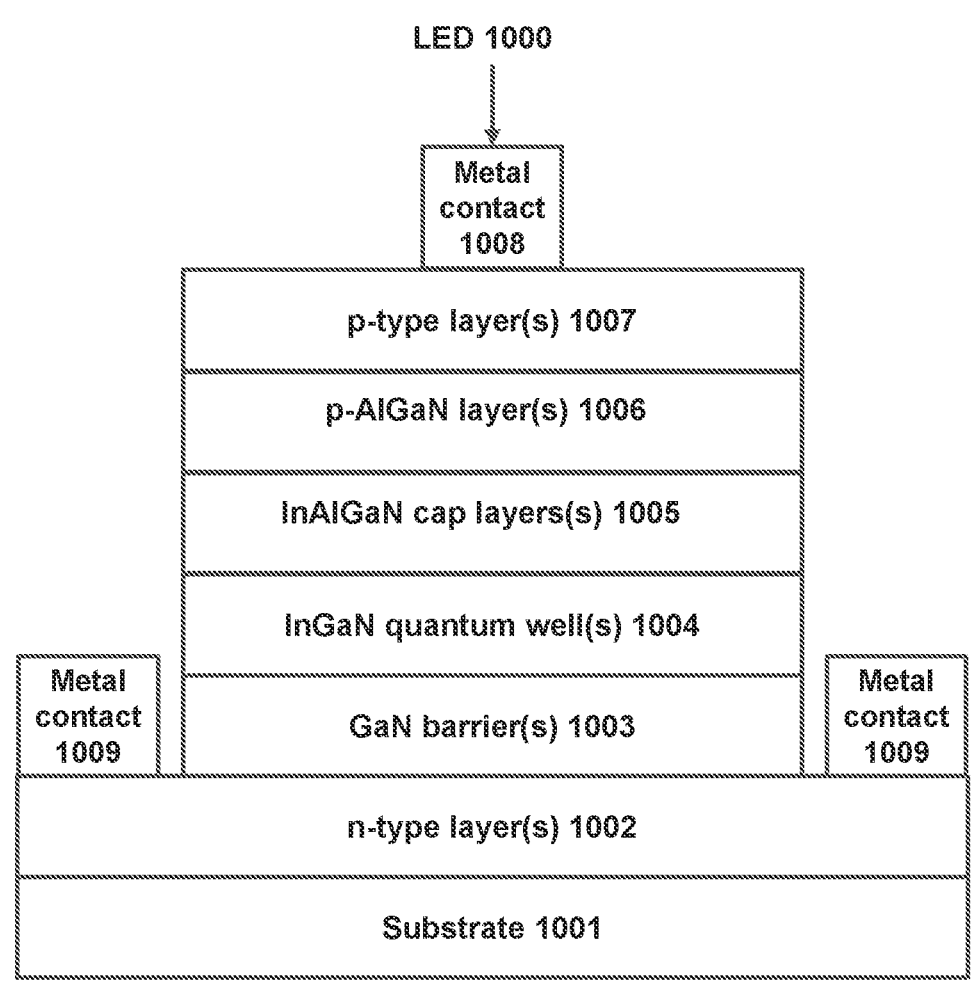
FIG. 10 is a cross-sectional schematic (side view) of a fully fabricated LED structure with metal contact layers and contact pads.

FIG. 10 is a cross-sectional schematic (side view) of a light-emitting diodes structure, according to one embodiment. This device structure is an LED 1000 comprised of a substrate 1001, upon which is deposited successively in the following order: an n-type GaN layer 1002 doped with Si, GaN quantum barrier(s) 1003, InGaN quantum well(s) 1004, InAlGaN cap layer(s) 1005, a p-type AlGaN layer 1006 doped with Mg, and a p-type GaN layer 1007 doped with Mg. To alleviate the strong piezoelectric field in the InGaN quantum wells 1004, the thickness of the InGaN quantum well 1004 can be reduced less than 2.5 nm. Therefore, the efficiency of LEDs can be increased.

Eleventh Embodiment

Figure 11:
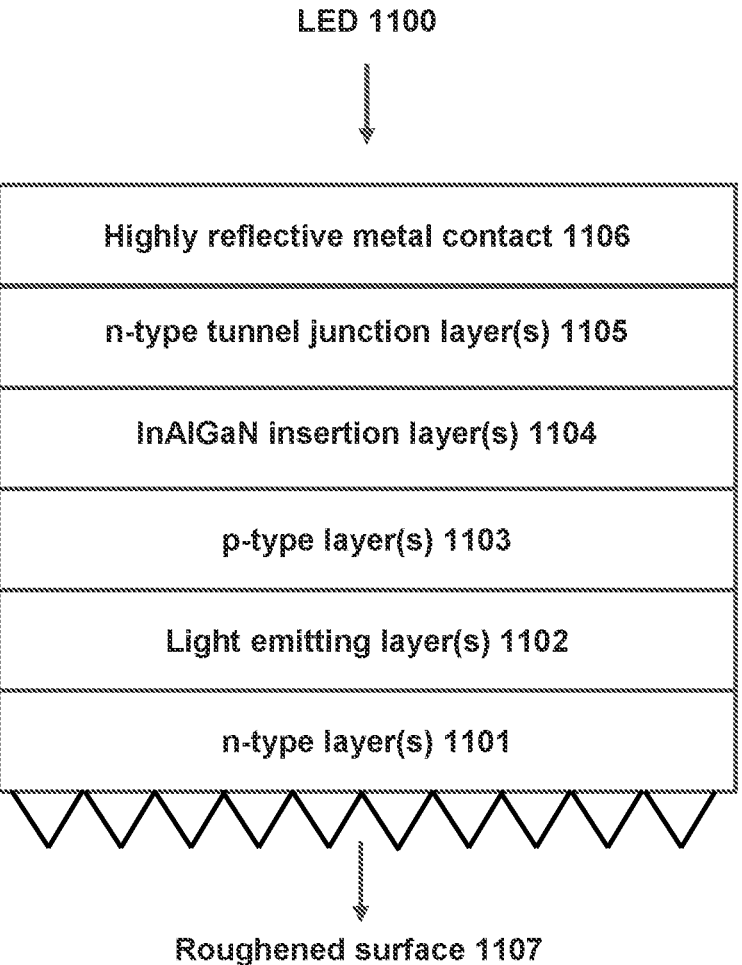
FIG. 11 is a cross-sectional schematic (side view) of a fully fabricated junction LED structure with high reflective metal contact layers on top of a tunnel junction, and having a roughened surface.

FIG. 11 is a cross-sectional schematic (side view) of a fully fabricated emitting layers device structure, according to one embodiment. This device structure is an LED 1100 comprised of a substrate (not shown), upon which is deposited successively in the following order: an n-type GaN layer 1101 doped with Si, a light emitting layer 1102 comprising an InGaN/GaN MQW structure, a p-type GaN layer 1103 doped with Mg, an $In_xAl_yGa_zN$ insertion layer 1104, an n-type tunnel junction layer 1105, and a highly, reflective metal contact 1106 such as Al or Al/Ag/Au stacks. In this embodiment, the substrate was removed by laser lift-off or otherwise, and the exposed surface of the s-type GaN layer 1101 was roughened 1107 by etching or otherwise to increase light extraction efficiency.

Experimental Results

Figure 12:
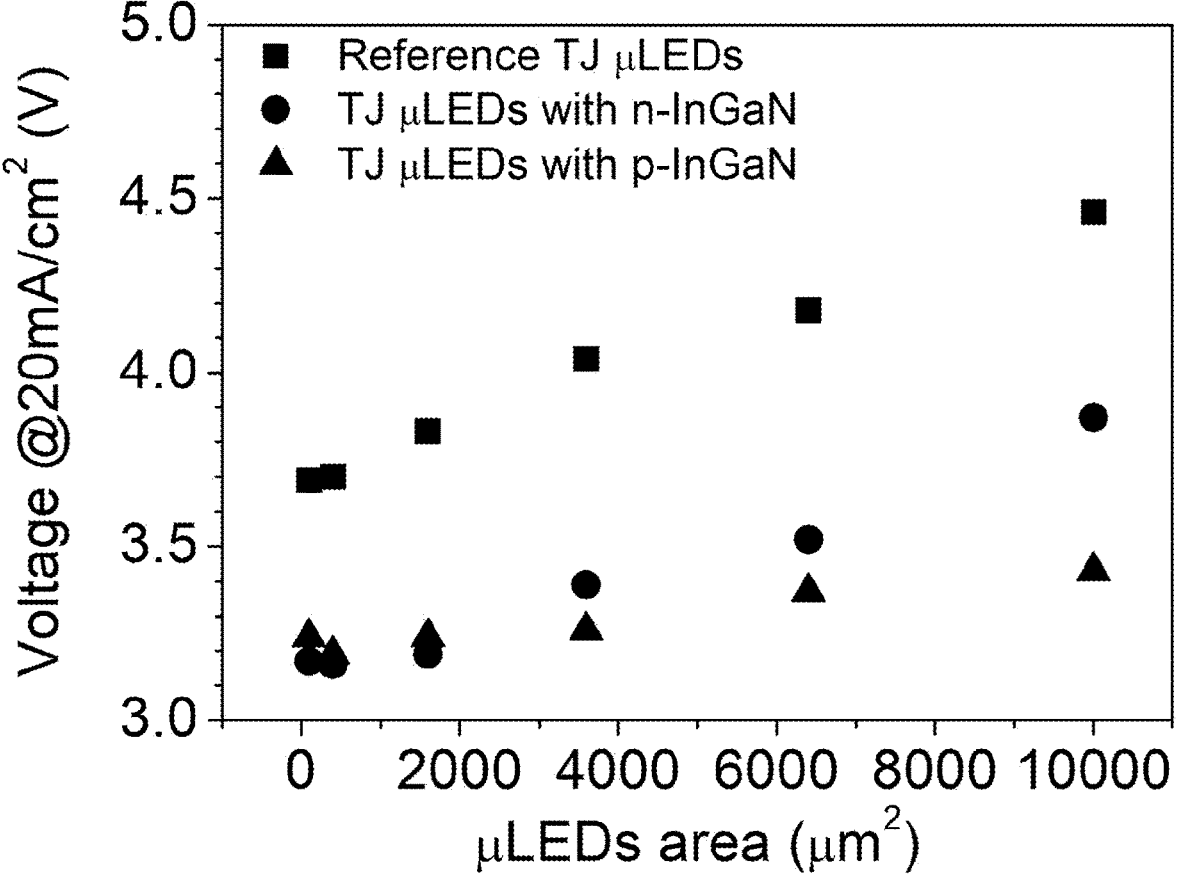
FIG. 12 is a plot of the forward voltage at 20 A/cm² of tunnel junction µLEDs with n-type and p-type InGaN insertion layers, and a reference tunnel junction µLED without an InGaN insertion layer.

FIG. 12 is a graph of forward voltage (V) vs. μLED area ($\mu m^2$) that describes the forward voltage at a working current density of 20 $A/cm^2$ for reference tunnel junction (TJ) μLEDs, and TJ μLEDs with n-type and p-type In $In_xAl_yGa_zN$ insertion layers. For the reference TJ μLEDs, the forward voltage shows a significant decrease from 4.5 V to 3.7 V as the μLED area is reduced from 10000 to 100 $\mu m^2$. For TJ μLEDs with n-type and p-type $In_xAl_yGa_zN$ insertion layers, the forward voltage is significantly reduced by at least 0.6 V Specifically, the forward voltage is reduced to 3.1 to 3.3 V when the μLED area is less than or equal to 1600 $\mu m^2$ for TJ μLEDs with n-type and p-type $In_xAl_yGa_zN$ insertion layers.

Figure 13:
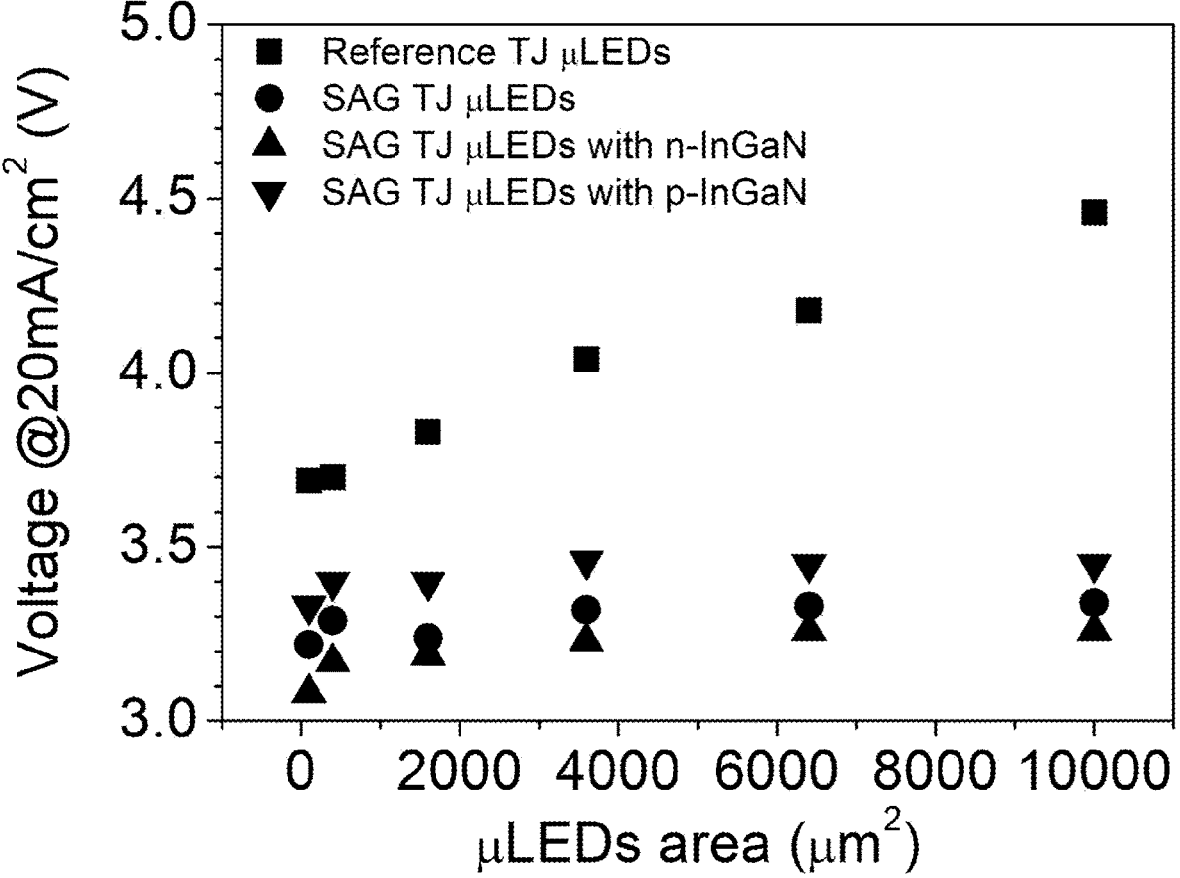
FIG. 13 is a plot of the forward voltage at 20 A/cm² of tunnel junction µLEDs with n-type and p-type InGaN insertion layers, and a reference tunnel junction µLED without an InGaN insertion layer utilizing selective area growth (SAG).

FIG. 13 is a graph of forward voltage (V) vs. µLED area (µm$^2$) that shows the forward voltage at a working current density of 20 A/cm$^2$ for reference TJ µLEDs, SAG TJ µLEDs, and SAG TJ µLEDs with n-type and p-type In$_x$A-l$_y$Ga$_z$N insertion layers. The SAG TJ µLEDs with n-type and p-type In$_x$Al$_y$Ga$_z$N insertion layers include: (1) SAG TJ µLEDs with an n+GaN tunnel junction layer and an exposed p-type layer, (2) SAG TJ µLEDs with an n−InGaN/n+GaN tunnel junction layer and an exposed p-type layer, and (3) SAG TJ µLEDs with a p−InGaN/n+GaN tunnel junction layer and an exposed p-type layer. All the SAG TJ µLEDs exhibit substantially size-independent voltage. For the SAG TJ µLEDs with an n−InGaN/n+GaN tunnel junction layer and an exposed p-type layer, a lowest voltage of 3.08 V is achieved. The voltage of the SAG TJ µLEDs with an n−InGaN/n+GaN tunnel junction layer varied from 3.08 V to 3.2 V.

Figure 14:
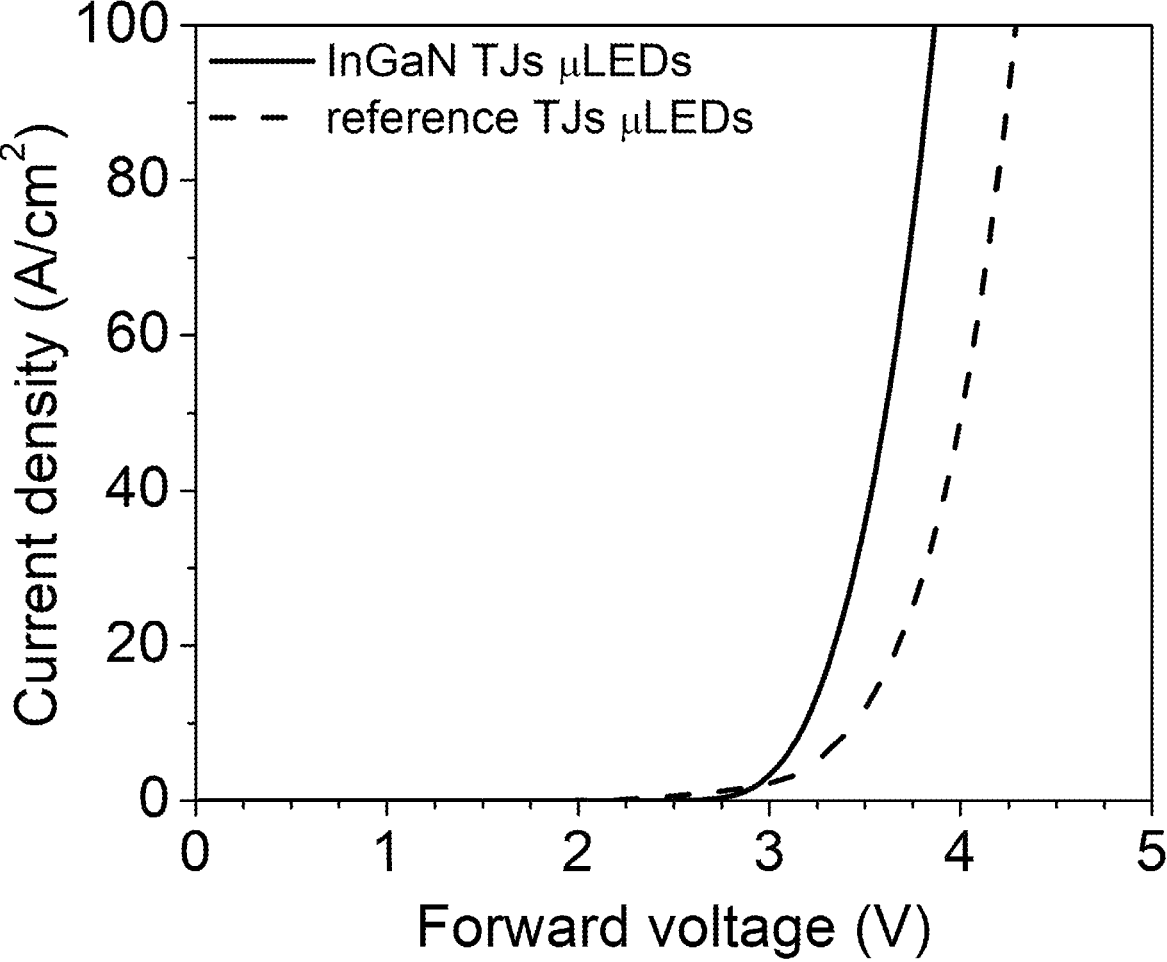
FIG. 14 is a plot of the voltage-current density of tunnel junction µLEDs with n-type and p-type InGaN insertion layers, and a reference tunnel junction µLED without an InGaN insertion layer.

FIG. 14 is a graph of current density (A/cm$^2$) vs. voltage (V) for reference TJ µLEDs and TJ µLEDs with an n−In-GaN/n+GaN tunnel junction layer. It clearly shows that the forward voltage at a working current density of 20 A/cm$^2$ of the TJ µLEDs with the n−InGaN/n+GaN tunnel junction layer is significantly reduced to 0.6 V.

Thus, it has been found that the forward voltage is very stable and uniform around 3.0 to 3.2 V for the SAG TJ µLEDs with the n−InGaN/n+GaN tunnel junction layer, which is extremely important for the application of µLEDs with different dimensions. This invention solves the issue of the high forward voltage in different size tunnel junction µLEDs. Moreover, this invention enables the realization of low forward voltage µLEDs with epitaxial tunnel junctions fabricated using MOCVD, which has large economic benefits.

Process Steps

Figure 15:
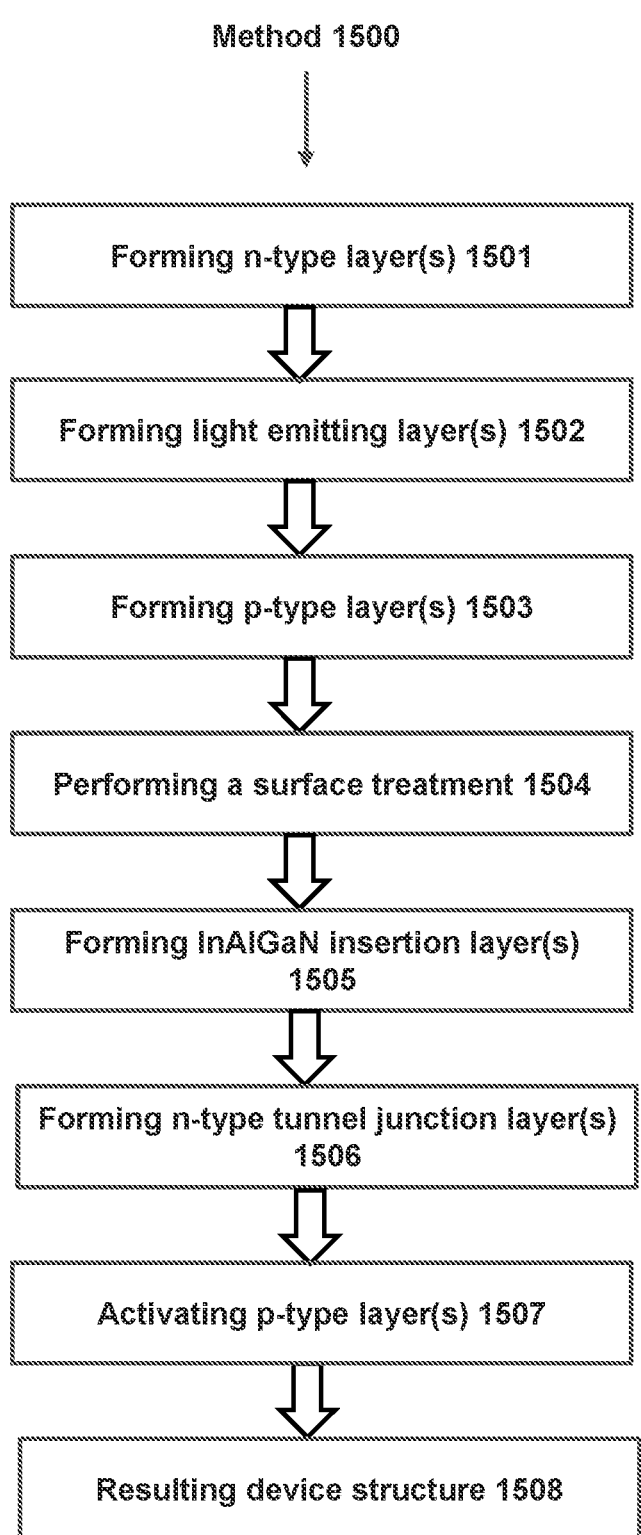
FIG. 15 is a process flow diagram for forming a tunnel junction with an $In_xAl_yGa_zN$ insertion layer on a III-nitride device.

FIG. 15 is a process flow diagram for a method 1200 of forming an In$_x$Al$_y$Ga$_z$N insertion layer and n-type tunnel junction with a p-type layer in a III-nitride semiconductor device, according to one embodiment. This method may be used to fabricate the III-nitride light emitting diode (LED) structures shown in FIGS. 1, 2, 3, 4, 5, 6, 7, 8, 9, and 10, wherein the resulting III-nitride LED structure includes at least one tunnel junction (TJ) comprised of a p-type III-nitride layer; an n-type III-nitride tunnel junction layer; and an In$_x$Al$_y$Ga$_z$N insertion layer between the p-type III-nitride layer and the n-type III-nitride tunnel junction layer, where $0<x\le1$, $0\le y<1$, $0\le z\le1$, and $x+y+z=1$.

Block 1501 represents the step of forming n-type layer(s) on or above a substrate. In one embodiment, the n-type layer is an n-type III-nitride layer, for example, the n-type III-nitride layer is comprised of GaN. In one embodiment, the n-type III-nitride layer is a n-type GaN layer that contains some indium.

Block 1502 represents the step of forming light emitting layer(s) on or above the n-type layers.

Block 1503 represents the step of forming p-type layer(s) on or above the light emitting layers. In one embodiment, the p-type layer is a p-type III-nitride layer, for example, the p-type III-nitride layer is comprised of GaN. In one embodiment, the p-type III-nitride layer is a p-type GaN layer that contains some indium.

Block 1504 represents the step of performing a surface treatment on the structure, wherein the surface treatment can include immersing subsequent layers in a reactive chemical such as HCl, HF, or another reactive chemical, and the surface treatments can also include subjecting the subsequent layers to a plasma source such as O$_2$ plasma or other plasma sources.

Block 1505 represents the step of forming In$_x$Al$_y$Ga$_z$N insertion layer(s) on or above the p-type layers. In one embodiment, the In$_x$Al$_y$Ga$_z$N insertion layer is n-type doped with a donor concentration $>1\times10^{19}$ cm$^{-3}$, wherein the donor is silicon (Si) or germanium (Ge). In another embodiment, the In$_x$Al$_y$Ga$_z$N layer is p-type doped with a donor concentration $>1\times10^{19}$ cm$^{-3}$, wherein the donor is magnesium (Mg) or Zinc (Zn).

Block 1506 represents the step of forming n-type tunnel junction layer(s) on or above the In$_x$Al$_y$Ga$_z$N insertion layers. In one embodiment, the In$_x$Al$_y$Ga$_z$N insertion layer and the n-type III-nitride tunnel junction layer are grown by metalorganic chemical vapor deposition (MOCVD). In one embodiment, the n-type tunnel junction layer is an n-type III-nitride tunnel junction layer, for example, the n-type III-nitride tunnel junction layer is comprised of GaN, wherein the In$_x$Al$_y$Ga$_z$N insertion layer has a lower energy bandgap than the GaN of the n-type tunnel junction layer. In one embodiment, the n-type III-nitride tunnel junction layer is an n-type GaN layer that contains some indium.

Block 1507 represents the optional step of activating the p-type III-nitride layers. In one embodiment, the p-type III-nitride layer is activated by removing hydrogen through access points in the n-type III-nitride tunnel junction layer or through sidewalls of a mesa, wherein the p-type III-nitride layer is activated by thermal annealing. In one embodiment, selective area growth (SAG) or epitaxial lateral overgrowth (ELOG) is used to make the access points in the n-type III-nitride tunnel junction layer. In another embodiment, inductively coupled plasma (ICP) or reactive ion etching (RIE) etching is used to expose the sidewalls of the mesa to access the p-type III-nitride layer.

Block 1508 represents the resulting device structure. In one embodiment, the resulting device structure is a III-nitride LED structure, for example, a III-nitride LED structure.

In one embodiment, the III-nitride LED structure includes at least one tunnel junction (TJ) comprised of a p-type III-nitride layer, an n-type III-nitride tunnel junction layer, and an In$_x$Al$_y$Ga$_z$N insertion layer between the p-type III-nitride layer and the n-type III-nitride tunnel junction layer; and the n-type III-nitride tunnel junction layer has one or more access points therein to a surface of the p-type III-nitride layer.

In one embodiment, the III-nitride LED structure is a micro-size III-nitride LED comprised of one or more access points therein to a surface of a p-type III-nitride layer or an exposed sidewall of the p-type III-nitride layer.

In one embodiment, the III-nitride LED structure is a micro-size III-nitride LED with an epitaxial tunnel junction comprised of p+GaN and n+GaN layers having a low forward voltage less than 3.45 V at a current density of 20 A/cm$^2$, for example, a size-independent forward voltage at 20 A cm$^{-2}$ that is stable and uniform around 3.08 V to 3.3V. The micro-size III-nitride LED has an area less than 10,000 µm$^2$ for example, dimensions ranging from 25 to 10,000 µm$^2$.

Alternatives and Modifications

The following describes possible alternatives and modifications to the present invention.

The n-type tunnel junction layer can be comprised of multiple films or layers having varying or graded compositions, a heterostructure comprising layers of dissimilar (Al, Ga, In, B)N composition, or one or more layers of dissimilar (Al, Ga, In, B)N composition. It can also be comprised of one or more films with various thickness, III-nitride compositions, and doping. These films may contain gallium, indium, aluminum, boron, or a combination thereof.

The n-type tunnel junction layer may comprise of unintentionally doped or intentionally doped films or layers, with elements such as iron, magnesium, silicon, oxygen, carbon, and/or zinc. The n-type tunnel junction layer may be grown using deposition methods comprising MOCVD, hydride vapor phase epitaxy (HVPE), or molecular beam epitaxy (MBE).

The structure may further comprise the n-type tunnel junction layer being grown in any crystallographic III-nitride direction, such as on a conventional polar c-plane oriented III-nitride semiconductor crystal, or on a nonpolar plane, such as a-plane or in-plane, or on any semi-polar plane.

In one or more embodiments, subsequent layers grown on the n-type tunnel junction layer may be comprised of a second n-type layer and a single metal contact deposition is used to fabricate contacts to both n-type layers of the device.

In one or more embodiments, the subsequent layers comprise a top n-type layer and the device does not include a p-contact.

In one or more embodiments, the method comprises repeating steps of so as to form multiple p-n junctions and tunnel junctions, wherein the tunnel junctions comprise an n-type tunnel junction layer and each buried n-type layer in the device is contacted, such that current flowing through each active region is controlled individually.

In one or more embodiments, magnesium (Mg) concentrations in the subsequent layers are suppressed, for example, through exposure to an acid, but not limited to, aqua regia, hydrofluoric acid and hydrochloric acid.

In one or more embodiments, Mg concentrations in the p-type layers are suppressed through flow modulation epitaxy, for example, low temperature flow modulation epitaxy.

In one or more embodiments, Mg is activated through the lateral diffusion of the hydrogen through the exposed p-type layers at elevated temperatures.

In one or more embodiments, the device is an LED and sheet resistance on both sides of the p-n junction is matched to reduce current crowding.

In one or more embodiments, the device is comprised of three cascaded LEDs with different emission colors.

In one or more embodiments, the device is comprised of at least cascaded LEDs with different emission colors bonded to a CMOS substrate to form a micro-display and increase the PPI.

In one or more embodiments, the device is a long wavelength InGaN LED, and quantum wells were reduced to improve the overlap of electro-hole wavefunctions and increase the efficiency.

In one or more embodiments, the device is an LED, and one or more of the n-GaN layers are roughened, to increase an extraction efficiency of the LED.

Nomenclature

The terms "nitride" or "III-nitride" or "Group-III nitride" as used herein refer to any alloy composition of the (Ga, Al, In, B)N semiconductors having the formula $Ga_nAl_xIn_yB_zN$ where: $0 \leq n \leq 1$, $0 \leq x \leq 1$, $0 \leq y \leq 1$, $0 \leq z \leq 1$, and $n+x+y+z=1$.

These terms as used herein are intended to be broadly construed to include respective nitrides of the single species, Ga, Al, In and B, as well as binary, ternary and quaternary compositions of such Group III metal species. Accordingly, these terms include, but are not limited to, the compounds of AlN, GaN, InN, AlGaN, AlInN, InGaN, and AlGaInN. When two or more of the (Ga, Al, In, B)N component species are present, all possible compositions, including stoichiometric proportions as well as off-stoichiometric proportions (with respect to the relative mole fractions present of each of the (Ga, Al, In, B)N component species that are present in the composition), can be employed within the broad scope of this invention. Further, compositions and materials within the scope of the invention may further include quantities of dopants and/or other impurity materials and/or other inclusional materials.

This invention also covers the selection of particular crystal orientations, directions, terminations and polarities of III-nitrides. When identifying crystal orientations, directions, terminations and polarities using Miller indices, the use of braces, { }, denotes a set of symmetry-equivalent planes, which are represented by the use of parentheses, ( ). The use of brackets, [ ], denotes a direction, while the use of brackets, < >, denotes a set of symmetry-equivalent directions.

Many III-nitride devices are grown along a polar orientation, namely a c-plane {0001} of the crystal, although this results in an undesirable quantum-confined Stark effect (QCSE), due to the existence of strong piezoelectric and spontaneous polarizations. One approach to decreasing polarization effects in III-nitride devices is to grow the devices along nonpolar or semipolar orientations of the crystal.

The term "nonpolar" includes the {11-20} planes, known collectively as a-planes, and the {10-10} planes, known collectively as m-planes. Such planes contain equal numbers of Group-III and Nitrogen atoms per plane and are charge-neutral. Subsequent nonpolar layers are equivalent to one another, so the bulk crystal will not be polarized along the growth direction.

The term "semipolar" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the crystal will have reduced polarization along the growth direction.

REFERENCES

The following publications are incorporated by reference herein:

[1] L. Esaki, "New Phenomenon in Narrow Germanium p-n Junctions," Phys, Rev., vol. 109, no. 2, pp. 603-604, January 1958.

[2] J. Simon, V. Protasenko, C. Liars, H. Xing, and D. Jena, "Polarization-induced hole doping in wide-band gap uniaxial semiconductor heterostructures," Science, vol. 327, no. 5961, pp. 60-4, January 2010.

[3] S. Krishnamoorthy, F. Akyol, and S. Rajan, "InGaN/GaN tunnel junctions for hole injection in GaN light emitting diodes," Appl. Phys. Lett., vol. 105, no. 14, p. 141104, October 2014.

[4] S. Krishnamoorthy, F. Akyol, P. S. Park, and S. Rajan, "Low resistance GaN/InGaN/GaN tunnel junctions," Appl. Phys. Lett., vol. 102, no. 11, 2013.

[5] P. Li, H. Zhang, H. Li, M. Iza, Y. Yao, M. S Wong, N. Palmquist, J. S Speck, S. Nakamura, S. P DenBaars, "Size-independent low voltage of InGaN micro-lightemitting diodes with epitaxial tunnel junctions using selective area growth by metalorganic chemical vapor deposition", Optics Express, 28, 18707 (2020).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method, comprising:

fabricating a III-nitride light emitting diode (LED) structure, wherein:

the III-nitride LED structure includes at least one tunnel junction (TJ) comprised of a p-type III-nitride layer; an n-type III-nitride tunnel junction layer; and an $In_xAl_yGa_zN$ insertion layer between the p-type III-nitride layer and the n-type III-nitride tunnel junction layer, where $0<x\leq1$, $0\leq y<1$, $0\leq z\leq1$, and $x+y+z=1$; and the p-type III-nitride layer is activated by removing hydrogen through access points in the n-type III-nitride tunnel junction layer and the $In_xAl_yGa_zN$ insertion layer that exposes a top surface of the p-type III-nitride layer.

2. The method of claim 1, wherein the p-type III-nitride layer and n-type III-nitride tunnel junction layer are comprised of GaN, and the $In_xAl_yGa_zN$ insertion layer has a lower energy bandgap than the GaN.

3. The method of claim 1, wherein the $In_xAl_yGa_zN$ insertion layer and the n-type III-nitride tunnel junction layer are grown by metalorganic chemical vapor deposition (MOCVD).

4. The method of claim 1, wherein the $In_xAl_yGa_zN$ insertion layer is n-type doped with a donor concentration $>1\times10^{19}$ $cm^{-3}$.

5. The method of claim 4, wherein the donor is silicon (Si) or germanium (Ge).

6. The method of claim 1, wherein the $In_xAl_yGa_zN$ insertion layer is p-type doped with a donor concentration $>1\times10^{19}$ $cm^{-3}$.

7. The method of claim 6, wherein the donor is magnesium (Mg) or Zinc (Zn).

8. The method of claim 1, wherein the p-type III-nitride layer is activated by removing hydrogen through sidewalls of a mesa.

9. The method of claim 1, wherein the p-type III-nitride layer is activated by thermal annealing.

10. The method of claim 1, wherein selective area growth (SAG) or epitaxial lateral overgrowth (ELOG) is used to make the access points in the n-type III-nitride tunnel junction layer and the $In_xAl_yGa_zN$ insertion layer.

11. The method of claim 8, wherein inductively coupled plasma (ICP) or reactive ion etching (RIE) etching is used to expose the sidewalls of the mesa to access the p-type III-nitride layer.

12. The method of claim 1, wherein the III-nitride LED structure comprises a micro-LED with an area less than 10,000 $\mu m^2$.

13. The method of claim 12, wherein the III-nitride LED structure has a forward voltage less than 3.45 V at a current density of 20 A/cm$^2$.

14. The method of claim 1, wherein the n-type III-nitride tunnel junction layer is an n-type GaN layer that contains some indium.

15. The method of claim 1, wherein the p-type III-nitride layer is a p-type GaN layer that contains some indium.

16. A device, comprising:

a III-nitride light emitting diode (LED) structure, wherein:

the III-nitride LED structure includes at least one tunnel junction (TJ) comprised of a p-type III-nitride layer, an n-type III-nitride tunnel junction layer, and an $In_xAl_yGa_zN$ insertion layer between the p-type III-nitride layer and the n-type III-nitride tunnel junction layer; and the n-type III-nitride tunnel junction layer and the $In_xAl_yGa_zN$ insertion layer have one or more access points therein to expose a top surface of the p-type III-nitride layer for removing hydrogen to activate the p-type III-nitride layer.

17. A device, comprising:

a micro-size III-nitride light emitting diode (LED) comprised of a p-type III-nitride layer, an n-type III-nitride tunnel junction layer, and an $In_xAl_yGa_zN$ insertion layer between the p-type III-nitride layer and the n-type III-nitride tunnel junction layer, where $0<x\leq1$, $0\leq y<1$, $0\leq z\leq1$, and $x+y+z=1$; and the p-type III-nitride layer is activated by removing hydrogen through one or more access points in the n-type III-nitride tunnel junction layer and the $In_xAl_yGa_zN$ insertion layer that expose a top surface of a p-type III-nitride layer.

18. A device, comprising:

a micro-size III-nitride light emitting diode (LED) with an epitaxial tunnel junction comprised of p+GaN and n+GaN layers with an $In_xAl_yGa_zN$ insertion layer between the p+GaN and n+GaN layers, where $0<x\leq1$, $0\leq y<1$, $0\leq z\leq1$, and $x+y+z=1$;

the p+GaN layer is activated by removing hydrogen through access points in the n+GaN layer and the $In_xAl_yGa_zN$ insertion layer that expose a top surface of the p+GaN layer; and the micro-size III-nitride light emitting diode (LED) having a low forward voltage less than 3.45 V at a current density of 20 A/cm$^2$.

19. The device of claim 18, wherein the micro-size III-nitride LED has dimensions ranging from 25 to 10,000 $\mu m^2$.

20. The device of claim 18, wherein the micro-size III-nitride LED has a size-independent forward voltage at 20 A cm$^{-2}$ that is stable and uniform around 3.08 V to 3.3V.

* * * * *